United States Patent
Beck

(10) Patent No.: US 10,088,545 B2
(45) Date of Patent: Oct. 2, 2018

(54) MAGNETIC RESONANCE APPARATUS AND METHOD FOR PROSPECTIVE MOTION CORRECTION

(71) Applicant: SIEMENS AKTIENGESELLSCHAFT, Munich (DE)

(72) Inventor: Thomas Beck, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 478 days.

(21) Appl. No.: 14/857,031

(22) Filed: Sep. 17, 2015

(65) Prior Publication Data

US 2016/0077180 A1 Mar. 17, 2016

(30) Foreign Application Priority Data

Sep. 17, 2014 (DE) .................. 10 2014 218 653

(51) Int. Cl.
| | |
|---|---|
| *G01V 3/00* | (2006.01) |
| *G01R 33/565* | (2006.01) |
| *G01R 33/48* | (2006.01) |
| *G01R 33/483* | (2006.01) |

(52) U.S. Cl.
CPC .... *G01R 33/56509* (2013.01); *G01R 33/4806* (2013.01); *G01R 33/4835* (2013.01)

(58) Field of Classification Search
CPC .......... G01R 33/56509; G01R 33/4806; G01R 33/4835
USPC ........................................................ 324/309
See application file for complete search history.

(56) References Cited

U.S. PATENT DOCUMENTS

| | | | |
|---|---|---|---|
| 2009/0010514 A1* | 1/2009 | Kimura | G01R 33/56509 382/131 |
| 2013/0187649 A1 | 7/2013 | Bhat et al. | |
| 2014/0062481 A1 | 3/2014 | Greiser et al. | |

OTHER PUBLICATIONS

Sussman et al., Variable-Density Adaptive Imaging for High-Resolution Coronary Artery MRI, 2002, Magnetic Resonance in Medicine 48:753-764.*
Thesen et al., "Prospective Acquisition Correction for Head Motion With Image-Based Tracking for Real-Time fMRI," Magnetic Resonance in Medicine, vol. 44, pp. 457-465 (2000).
Van Der Kouwe et al., "Real-Time Rigid Body Motion Correction and Shimming Using Cloverleaf Navigators," Magnetic Resonance in Medicine, vol. 56, pp. 1019-1032 (2006).
Tisdall et al., "MPRAGE Using EPI Navigators for Prospective Motion Correction," Proc. Intl. Soc. Mag. Reson. Med., vol. 17, p. 4656 (2009).

(Continued)

*Primary Examiner* — Susan Lee
(74) *Attorney, Agent, or Firm* — Schiff Hardin LLP

(57) ABSTRACT

For prospective motion correction in magnetic resonance imaging, first magnetic resonance data that map a first sub-region of a region of interest are acquired. Motion correction parameters are determined based on a comparison of at least the first magnetic resonance data with reference magnetic resonance data that map the region of interest. Second magnetic resonance data that map a second sub-region of the region of interest are determined using prospective motion correction based on the motion correction parameters. A magnetic resonance image is determined based on the first magnetic resonance data and based on the second magnetic resonance data.

15 Claims, 8 Drawing Sheets

(56) References Cited

OTHER PUBLICATIONS

White et al., "PROMO—Real-time Prospective Motion Correction in MRI using Image-based Tracking," Magn. Reson. Med., vol. 63(1), pp. 91-105 (2010).

Thesen, "Retrospektive and prospektive Verfahren zur bildbasierten Korrektur von Patientenkopfbewegungen bei neurofunktioneller Magnetresonanztomographie in Echtzeit," Doctoral Thesis Universität Heidelberg, pp. 1-157 (2001).

Kober et al., "Head Motion Detection Using FID Navigators," Magnetic Resonance in Medicine, vol. 66, pp. 135-143 (2011).

Zaitsev et al., "Magnetic resonance imaging of freely moving objects: Prospective real-time motion correction using an external optical motion tracking system," NeuroImage, vol. 31, pp. 1038-1050 (2006).

Jenkinson et al., "Improved Optimization for the Robust and Accurate Linear Registration and Motion Correction of Brain Images," NeuroImage, vol. 17, pp. 825-841 (2002).

Gedamu et al., "Subject Movement During Multislice Interleaved MR Acquisitions: Prevalence and Potential Effect on MRI-Derived Brain Pathology Measurements and Multicenter Clinical Trials of Therapeutics for Multiple Sclerosis," Journal of Magnetic Resonance Imaging, vol. 36, pp. 332-343 (2012).

Oakes et al., "Comparison of fMRI motion correction software tools," NeuroImage, vol. 28, pp. 529-543 (2005).

Beall et al., "SimPACE: Generating simulated motion corrupted BOLD data with synthetic-navigated acquisition for the development and evaluation of SLOMOCO: A new, highly effective slicewise motion correction," NeuroImage, vol. 101, pp. 21-34 (2014).

Tisdall et al., "Volumetric Navigators (vNavs) for Prospective Motion Correction and Selective Reacquisition in Neuroanatomical MRI," Magnetic Resonance in Medicine, vol. 68, pp. 389-399 (2012).

\* cited by examiner

MAGNETIC RESONANCE APPARATUS AND METHOD FOR PROSPECTIVE MOTION CORRECTION

BACKGROUND OF THE INVENTION

Field of the Invention

The present invention concerns a method for magnetic resonance imaging using prospective motion correction and a corresponding magnetic resonance system.

Description of the Prior Art

In magnetic resonance (MR) imaging, an MR image is produced which maps a region of interest. A certain period of time (scan time) is typically required for obtaining the MR data. It may happen that an object being scanned moves during the scan time. This motion often reduces the MR image quality. For example, motion artifacts occur.

Techniques for reducing motion artifacts (motion correction) are well known. Motion correction is often also termed motion compensation. Reduction can mean complete or partial elimination of the motion artifacts. In particular, so-called prospective motion corrections are known. Here information about the motion is obtained even during MR data acquisition (scanning) and this information is used for motion correction as scanning proceeds. Parameters of a scan sequence are typically adjusted such that the motion is counteracted.

Prospective motion correction can be differentiated from retrospective motion correction, for example, in which motion correction is carried out when scanning is complete, which means that the parameters of the scan sequence can no longer be adjusted.

Purely retrospective techniques suffer from an inherently limited motion correction accuracy; no prospective adjustment of the scan sequence parameters is possible. As a result, it may occur that certain information is basically not obtained and has to be reconstructed by particular model assumptions or interpolated. This can result in distortions. Moreover, such techniques require significant computing capacities.

Techniques are also known, for example, in which so-called navigator scans are slotted in during the scan time and allow prospective motion correction, see e.g. A. van der Kouwe et al., "Real-time rigid body motion correction and shimming using cloverleaf navigators" in Magn. Reson. Med. 56 (2006) 1019-1032 or M. D. Tisdall et al., "Volumetric navigators for prospective motion correction and selective reacquisition in neuroanatomical MRI" in Magn. Reson. Med 68 (2012) 389-399. Additional navigator images are sampled in order to detect and correct the motion. In addition, the motion is typically modeled by an extended Kalman filter for state change, see e.g. N. White et al., "PROMO: Real-time prospective motion correction in MRI using image-based tracking" in Magn. Reson. Med 63 (2010) 91-105. The use of navigators can increase scan sequence complexity. Thus it may be necessary to adjust the chronological order of the scan sequence such that the navigators can be slotted in.

Prospective motion correction techniques based on external camera systems are also known. The motion can be detected by a camera system. However, this typically requires a considerable hardware overhead, see e.g. M. Zaitsev et al., "Magnetic resonance imaging of freely moving objects: prospective real-time motion correction using an external optical motion tracking system." in Neuroimage 31 (2006) 1038-1050. In addition, the hardware components used must be capable of operating even in the powerful main magnetic field of the MR system and should not cause artifacts due to abrupt susceptibility changes, for example.

Prospective motion correction in conjunction with so-called functional MR imaging (fMRI), for example, is known. For fMRI, a time series of volumetric MR images is generated and the change in MR image intensity caused therein by a blood-oxygen-level-dependent (BOLD) change in blood flow is examined (BOLD contrast). During the scan, the patient performs a wide range of tasks, known as paradigms, for selectively activating individual brain areas, such as observing a visual stimulus—e.g. flickering chessboard pattern, emotive pictures —, motor tasks—e.g. finger tapping—, through to perceiving acoustic stimuli. Statistical analysis of the correlation between the change in the BOLD contrast in the MR images generated and the simultaneously performed paradigms provides the activation of the respective areas of the brain in the form of statistical result cards.

Even relatively small movements, particularly head movements, e.g. in the order of millimeters, as can occur during the measurement of neurofunctional images with fMRI, can result in significant motion artifacts and impairments of the statistical result cards generated. Physiological information may be lost as a result.

In order to correct patient movement, prospective motion corrections and/or retrospective motion corrections can be used. Particularly in the case of fMRI, motion correction constitutes a central part of image processing, enabling the detected activation and therefore conformance to the paradigm to be increased by up to 20% and the size of the activation area up to 100%, see e.g. T. R. Oakes, et al. "Comparison of fMRI motion correction software tools." in Neuroimage 28 (2005) 529-543. In this connection, techniques are known, for example, in which, based on an MR image of the time series of MR images, motion correction parameters are generated for subsequently acquired MR data for another MR image. For which, see S. Thesen et al., "Prospective Acquisition Correction for Head Motion With Image-Based Tracking for Real-Time fMRI" in Magn. Reson. Med. 44 (2000) 457-465, where FIG. 1 shows that the MR image (n+1) is measured using prospective motion correction based on motion correction parameters of the measurement of the MR image (n). For this purpose the MR data of the MR image (n+1) is registered onto reference MR data.

However, such an approach has certain disadvantages and limitations. For example, significant patient motion may already occur during the scan time for one or more MR images. It is then impossible, or only possible to a limited extent, to determine motion correction parameters for a subsequently acquired MR image. In particular, it can be possible that no unambiguous transformation for determining the motion correction parameters can be ascertained.

SUMMARY OF THE INVENTION

There is therefore a need for improved prospective motion correction techniques. In particular, there is a need for techniques providing precise motion correction also for movements that take place over a comparatively short timescale.

An object of the present invention is to respond to those needs.

This object is achieved in accordance with the present invention by a method for MR imaging using prospective motion correction that includes acquiring first MR data that map a first sub-region of a region of interest, and determining motion correction parameters based on a comparison of at least the first MR data with reference MR data that map the region of interest. The method further includes acquiring second MR data that map a second sub-region of the region of interest. Acquisition of the second MR data takes place using prospective motion correction based on the motion correction parameters. The method further includes generating an MR image based on a combination of at least the first MR data and the second MR data.

The inventive method is based on the insight that, for determining the motion correction parameters, the region of interest should not be regarded as a whole, but rather split or divided into individual blocks, i.e. the aforementioned sub-regions. As a result, movements taking place on a short timescale compared to the scan time of the complete MR image can also be taken into account relatively precisely. This is achieved by the scan time being subdivided for acquiring the first MR data and the second MR data, respectively. It is not necessary for the entire region of interest to consist of a disjunctive combination of the individual sub-regions. Advantageously, individual sub-regions can overlap, thereby increasing the robustness of the method. For example, sub-regions for which MR data are acquired in a time-sequential manner can overlap.

The reference MR data can be predefined, for example. It is also possible for the method to additionally include the acquisition of the reference MR data using a reference scan sequence. The reference MR data can have a different resolution from the first MR data and the second MR data. For example, the reference MR data can have a lower resolution than the first MR data and the second MR data. In general it is not necessary for the reference MR data to be acquired using the same scan sequence as that with which the first MR data and the second MR data is acquired. If, for example, the first MR data and the second MR data are acquired at an fMRI scan frequency, it is not necessary for the reference MR data also to have a BOLD contrast.

In particular, it may be desirable that the reference MR data to be acquired using the reference scan frequency such that an acquisition time for acquiring the reference MR data is comparatively short. In particular, it may be desirable if no or no significant patient movement takes place during acquisition of the reference MR data. Systematic errors in motion correction can thus be prevented.

For example, it is possible for the reference MR data to be acquired prior to acquisition of the first MR data—e.g. in a calibration sequence. At the same time it may be desirable for the time interval between acquisition of the reference MR data and acquisition of the first MR data to be comparatively short, so that, for example, systematic shifting of the patient e.g. due to an abrupt movement is comparatively unlikely. In the case of fMRI, it may be desirable not to carry out the reference MR data until a respective paradigm has started, as an unintentional patient movement may be caused by trial startup. In this context, additional times can optionally also be added at the start of the trial, but which will not be used for subsequent analysis.

It is also possible to use a different scan sequence for acquiring the reference MR data from that used for acquiring the first MR data and the second MR data. In particular, the scan sequence with which the reference MR data is acquired can allow a shorter acquisition time. For example, the scan sequence with which the reference MR data is acquired can be a Fast Low Angle Shot Magnetic Resonance Imaging (FLASH) scan sequence. By reducing the acquisition time of the reference MR data, movements during acquisition of the reference MR data can be reduced. This prevents systematic errors in motion correction. A changed contrast of the reference MR data with respect to the first MR data and the second MR data—e.g. a T1 or T2 contrast vs. BOLD contrast—can be taken into account by using a similarity measure based on the transinformation (mutual information) to detect the movement when comparing. Such a similarity measure is typically independent of the contrast of the MR data which is being compared. It is therefore robust against a contrast variation in the reference MR data. It is optionally possible—as described above—for the reference MR data to be acquired with a lower resolution than the first MR data and the second MR data; the reduced resolution can be increased e.g. by an interpolation prior to the comparison in the course of determining the motion correction parameters by post-processing to a value which corresponds to the resolution of the first MR data and of the second MR data. The acquisition time for obtaining the reference MR data can also be reduced in this way.

The first sub-region can be different from the second sub-region. This means that the first sub-region comprises at least some spatial points that are not in the second sub-region. The first sub-region and the second sub-region can overlap or be disjunctive, viewed in the time domain and/or spatial domain. It is possible, for example, for the first sub-region to be continuous, i.e. not broken by the second sub-region. However, it is also possible for the first sub-region to be discontinuous, i.e. broken by the second sub-region. The first sub-region and the second sub-region can each be smaller than the region of interest and be included thereby. The first sub-region can be adjacent to, or spaced apart from, the second sub-region.

Taking the first sub-region and the second sub-regions into account ensures that the motion correction parameters for the second MR data can be determined on the basis of the first MR data, wherein the acquisition time for obtaining the first MR data is shorter than the scan time of the MR image. This means that the patient's movement can be taken into account more precisely when determining the motion correction parameters; time averaging, etc. is less severe.

In general, different prospective motion correction techniques can be used. In particular, it is possible for the motion correction parameters to describe a rigid transformation of the first MR data to the reference MR data. In the case of rigid transformation, it is typically assumed that the transformation can be sufficiently precisely described by translational degrees of freedom and rotational degrees of freedom. In particular, it is typically assumed that the motion produces no deformation—e.g. compression, shearing, etc.—of the region of interest. For example, the number of degrees of freedom which are taken into account as part of the rigid transformation can be limited. For example, it is possible for three rotational and three translational degrees of freedom to be taken into account. Reflections and/or intensity changes can often additionally be taken into account as part of the rigid transformation. For example, as an option to the translational and rotational degrees of freedom, a degree of freedom in respect of an intensity could be taken into account (intensity scaling). The rigid transformation is typically to be differentiated from affine transformations or elastic transformations (non-rigid transformation).

Using a rigid transformation for determining the motion correction parameters can have the effect of reducing the computing capacity required—particularly compared to cases of non-rigid transformation. In particular, this may enable the motion correction parameters to be determined comparatively quickly. This enables the scan time made up of at least the MR data acquisition times and dead times for determining the motion parameters to be reduced.

The prospective motion correction can be carried out using well-known techniques. For example, the motion correction parameters can be predefined as control parameters of a sequence controller which selects parameters of a corresponding scan sequence which provides the first MR data and the second MR data. On the basis of the motion correction parameters, e.g. gradient pulses which effect slice selection of a slice of the region of interest for acquisition of the first MR data or the second MR data can be adjusted to the motion. The slice position can be selected by the motion correction parameters such that the detected motion is compensated.

The first MR data and the second MR data can be brought together—e.g. after a Fourier transformation of raw data into the image space—in order thus to generate the MR image. In general it is possible to take other MR data into account, i.e. to subdivide the region of interest into further sub-regions—in addition to the first sub-region and the second sub-region. This can enable the motion correction parameters to be determined particularly precisely by taking comparatively small movements into account. For example, the method can also include the acquisition of third MR data which images a third sub-region of the region of interest. In this regard it can be possible also to apply the above described motion correction techniques to the third MR data. For example, the method can also include determining further motion correction parameters based on a comparison of at least the second MR data with the reference MR data. It may then be possible for the acquisition of the third MR data to be carried out using prospective motion correction based on the further motion correction parameters. The generation of the MR image can then be based on a combination of at least the first MR data, the second MR data and the third MR data.

Primarily prospective motion correction techniques have been illustrated above. In addition it would also be possible to use retrospective motion correction techniques. It can be possible for the retrospective motion correction to operate on the entire region of interest. It would also be possible for the retrospective motion correction to operate on the sub-regions. For example, generating the MR image can also include determining retrospective motion correction parameters. The determining of the retrospective motion correction parameters can be based e.g. on a comparison of the first MR data with the reference MR data or with other MR data which maps the region of interest. It is then possible to carry out retrospective motion correction of the first MR data based on the retrospective motion correction parameters. Corresponding techniques can also be applied for the second or third MR data. The above illustrate that it is not necessary to use the same reference MR data for prospective motion correction and retrospective motion correction.

It is possible for further MR data or MR data other than the first MR data itself to be taken into account for determining the retrospective motion correction parameters for correction of the first MR data. In general, both prospective motion correction and retrospective motion correction can therefore be carried out; the two techniques can be carried out completely independently of one another. This means that the sub-regions do not need to be used. For example, whereas prospective motion correction subdivides the region of interest into the sub-regions or blocks, retrospective motion correction can consider the entire region of interest independently thereof. Another reference volume or other reference MR data could also be selected for retrospective motion correction. This is possible, as all the MR data is completely available retrospectively.

As part of retrospective motion correction, e.g. regridding and/or interpolation of the acquired MR data in respect of the patient's movement indicated by the retrospective motion correction parameters can take place. Corresponding techniques are well known to those skilled in the art and therefore need not be discussed in further detail herein.

Combining prospective motion correction with retrospective motion correction enables particularly precise motion correction of the MR image to be achieved. This increases the quality of the MR image.

It may often be desirable to display various physical processes in the region of interest with a certain time resolution. It may therefore be possible for the above techniques to be repeated to acquire another MR image, e.g. after a particular repetition time. For example, acquiring the first MR data, determining the motion correction parameters, acquiring the second MR data, and generating the MR image can be repeated many times to obtain a time series of MR images, e.g. after a repetition time in each case.

Techniques in which the region of interest is subdivided into two or more sub-regions have therefore been illustrated above. For MR data which is acquired for a particular sub-region, prospective motion correction based on motion correction parameters which are determined from previously acquired MR data for another sub-region can take place. This can also apply if the MR data is taken into account for producing one MR image and the previously acquired MR data is taken into account for producing another MR image.

In various scenarios, the MR data acquired immediately previously can be used for determining the motion correction parameters for the subsequently acquired MR data.

In various scenarios it can be possible for only the MR data of a single sub-region of the region of interest to be used for determining the motion correction parameters of subsequently acquired MR data. However, it is also possible for the motion correction parameters to be determined on the basis of MR data of a plurality of sub-regions. For example, it would be possible, for particular MR data, for the associated motion correction parameters to be determined for other sub-regions on the basis of the two, three or four previously acquired MR data. In other words it is possible for multiple sub-regions to be taken into account for determining the motion correction parameters. Thus, the robustness with which the motion correction parameters are determined can be increased. The probability of outliers when determining the motion correction parameters can be reduced. The fact that movements typically proceed continuously can be taken into account. The continuous movements are present particularly when the patient must not move during the scan time or is immobilized.

In general, the above described techniques can be applied to a wide variety of MR imaging variants. For example, it would be possible to use the above prospective motion correction techniques in a perfusion or angiographic MR imaging context. It would also be possible to use the above described techniques in a chemical-shift MR imaging context. It would also be possible to use the above described techniques in fMRI.

For example, the first MR data can be acquired using a first scan sequence and the second MR data can be acquired using a second scan sequence. It is e.g. possible for the first scan sequence and the second scan sequence to correspond to one another, wherein e.g. different parameters of the scan sequence such as gradient pulse amplitude, sampled slices, etc. can be varied.

It is possible, for example, for the first scan sequence and the second scan sequence to relate to fMRI and the first MR data and the second MR data to exhibit a BOLD contrast.

In general it is possible for the first scan sequence and the second scan sequence to be three-dimensional scan sequences. However, it is also possible for the first scan sequence to be a two-dimensional scan sequence which samples at least one slice of the region of interest in order to acquire the first MR data. It is accordingly possible for the second scan sequence to be a two-dimensional scan sequence which samples at least one slice of the region of interest in order to acquire the second MR data.

For example, the first scan sequence can sample a single slice of the region of interest in order to acquire the first MR data. Determining the motion correction parameters can include, for example, carrying out slice-to-volume registration (see e.g. E. B. Beall et al., "SimPACE: Generating simulated motion corrupted BOLD data with synthetic-navigated acquisition for the development and evaluation of SLOMOCO: A new, highly effective slicewise motion correction" in NeuroImage 101 (2014) 21-34) of the first MR data to the reference MR data. The same can also apply to the second MR data.

In general, it can therefore be possible for the first MR data to sample only a comparatively small number of k-space points or slices. This enables the motion content to be reduced during acquisition of the first MR data. The sampling time for acquiring the first MR data or the second MR data can be particularly short. At the same time it may be necessary to take particular care when comparing the first MR data with the reference MR data: it is possible that, due to the reduced base data of the first MR data, the comparison—e.g. in the form of registration—is comparatively more sensitive to noise or local image artifacts.

The above described reduction in the base data to just one sampled slice, for example, can also be used for the second MR data.

Particularly in such cases as described above, it may be desirable to subdivide the region of interest into a comparatively large number of sub-regions.

However, it would also be possible for the first scan sequence for acquiring the first MR data to sample a plurality of slices of the region of interest. Accordingly, the second scan sequence for acquiring the second MR data can also sample a plurality of slices of the region of interest. The first scan sequence and the second scan sequence can sample the region of interest e.g. in a slice-interleaved manner in relation to one another. In other words, it can therefore be possible for the first sub-region to be broken by the second sub-region. The interleaved sampling can mean, for example: spatially adjacent MR image slices are assigned—e.g. alternately—to the first MR data and the second MR data; anatomically adjacent slices are therefore not scanned in a time-adjacent adjacent manner.

Various effects can be achieved by the interleaved acquisition of the first MR data and the second MR data. It is possible for there to be a comparatively long time between the acquisition of MR data for spatially adjacent slices—in which e.g. MR data for other, more distant slices is acquired. In this way, for fMRI a BOLD-contrast-distorting interaction between spatially adjacent slices can be reduced.

In addition, it is possible to determine the motion correction parameters particularly precisely. The slices of the first MR data in the interleaved acquisition scenario are spaced farther apart in the spatial domain or rather are distributed over a larger spatial area—this is the case, as at least one slice of the second MR data is disposed between two slices of the first MR data. MR data relating to slices which are disposed over a comparatively large area in the spatial domain can in turn be compared particularly reliably with the reference MR data. It is then possible to determine the motion correction parameters particularly precisely.

The above shows that the prospective motion correction techniques described have particular advantages when used for regions of interest that are sampled in an interleaved manner. However, corresponding techniques can also be used in scenarios without interleaved sampling of the region of interest. In such a case the rigid transformation assumption can be particularly well fulfilled, in particular for comparatively lengthy scans.

For example, the first scan sequence for acquiring the first MR data can therefore sample a plurality of slices of the region of interest and the second scan sequence for acquiring the second MR data can also sample a plurality of slices of the region of interest. The first scan sequence and the second scan sequence can sample the region of interest in a non-slice-interleaved manner in relation to one another. For example, the first scan sequence and the second scan sequence can sample the region of interest relative to one another in an anatomical sequence or rather in ascending or descending order according to the spatial position.

The above object also is achieved in accordance with the invention by an MR system designed for MR imaging with prospective motion correction. The MR system has a scanner that includes an RF transmit/receive arrangement and a processor. The scanner is operated to acquire first MR data that map a first sub-region of a region of interest. The processor is configured to determine motion correction parameters based on a comparison of at least the first MR data with reference MR data. The reference MR data map the region of interest. The scanner is additionally configured to acquire second MR data that map a second sub-region of the region of interest, using prospective motion correction based on the motion correction parameters. The processor is also configured to produce an MR image based on a combination of at least the first MR data and the second MR data.

The MR system according to the invention thus is configured to implement the method for MR imaging according to the present invention.

The MR system according to the invention achieves results that are comparable to those achieved with the method for MR imaging according to the present invention.

The features presented above and features which will be described below can be used not only in the corresponding explicitly stated combinations, but also in other combinations or in isolation, without departing from the scope of the invention.

DESCRIPTION OF THE PREFERRED EMBODIMENTS

Figure 1:
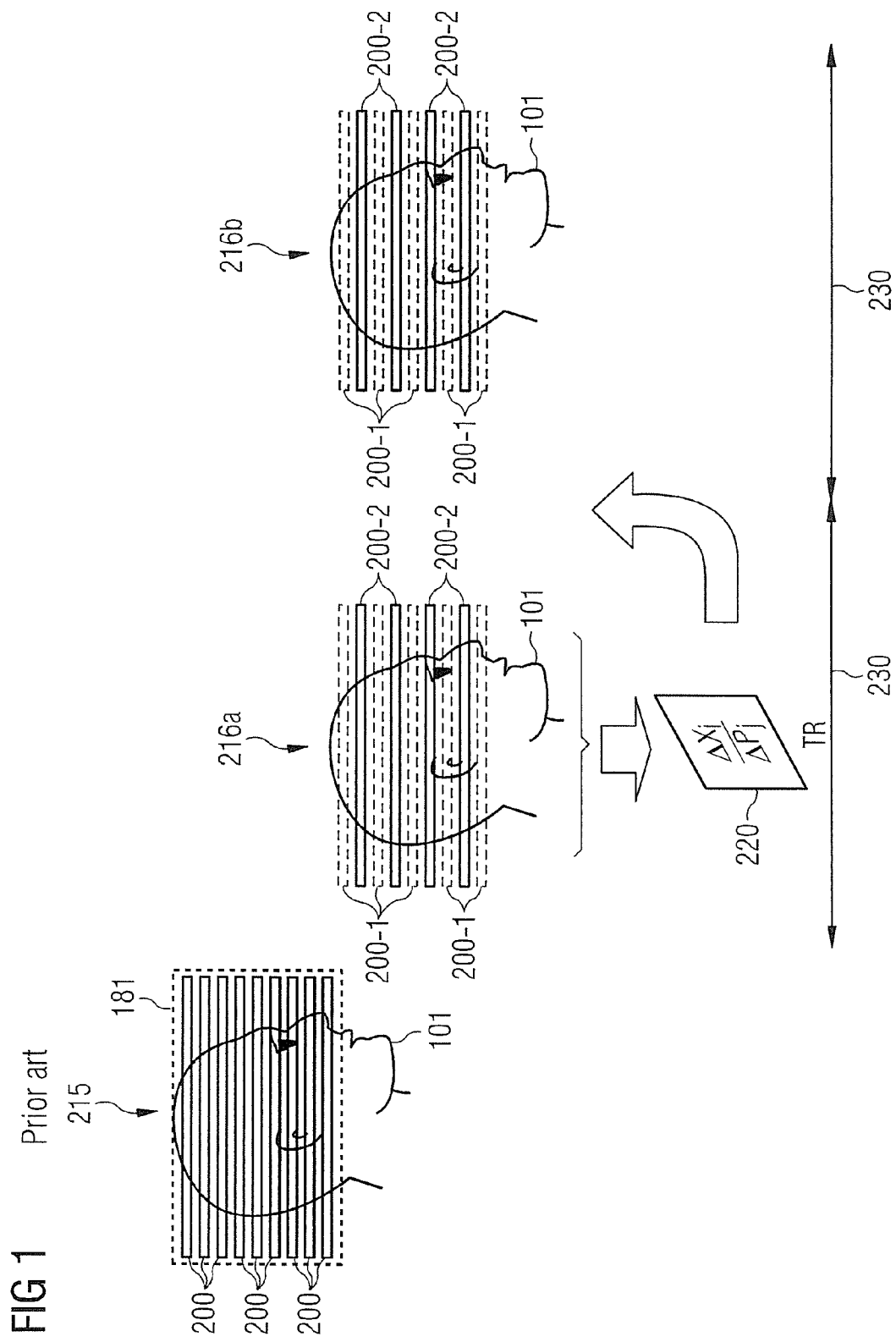
FIG. 1 illustrates a technique for prospective motion correction according to the prior art.

The present invention will now be explained in greater detail using preferred embodiments with reference to the accompanying drawings. In the figures, the same reference characters denote identical or similar elements. The figures are schematic representations of different embodiments of the invention. Elements shown in the figures are not necessarily drawn to scale. Rather the various elements shown in the figures are reproduced such that their function and general purpose will be understandable to the average person skilled in the art. Connections and links between functional units and elements shown in the figures can also be implemented as an indirect connection or link. A connection or link can be implemented in a wired or wireless manner. Functional units can be implemented as hardware, software or a combination of hardware and software.

Techniques for prospective motion correction in MR imaging will now be explained. A region of interest to be imaged is subdivided into multiple sub-regions. MR data are acquired sequentially for the different sub-regions, e.g. in an interleaved scheme. On the basis of the MR data acquired for the (n)th sub-region, prospective motion correction can take place for the (n+m)th sub-region, where m>=1.

These techniques can be used for fMRI in various scenarios. Here a time series of MR images, each exhibiting a BOLD contrast, is acquired. Consecutive MR images are acquired with a repetition time TR. The scan time for an MR image is less than or greater than the repetition time TR. In the case of fMRI, the MR data is typically acquired according to an interleaved sampling scheme. This means that anatomically adjacent slices are not scanned time-sequentially, as anatomically adjacent slices would typically be subject to excessive mutual interference (crosstalk). In order to minimize such artifacts, the time interval between the acquisition of MR data between anatomically adjacent slices is typically maximized. This is typically achieved in practice in the case of an even number of slices to be sampled (e.g. 36 slices) by sampling all the slices with odd indices in a first pass before sampling all the slices with even indices in a second pass; slice numbering beginning with zero can be assumed here. This means that the slices are sampled in the following sequence: 1, 3, 5, 7, . . . , 31, 33, 35, 0, 2, 4, . . . , 30, 32, 34. For odd numbers of slices, this principle applies accordingly, e.g. the slices with odd indices can be sampled first.

The chronological arrangement of the time points at which the MR data is acquired for the different slices is also typically uniformly distributed with maximum spacing. In a typical example, a region of interest consisting of N=48 slices would be acquired after a repetition time TR=3000 ms in each case. The uniform time distribution of the different slices means that a slice is sampled after 62.5 ms in each case, i.e. 48×62.5 ms=3000 ms. As described above, an interleaved sampling scheme can now be applied, with the result that the slice with index 1 would be sampled a time point T1=0 ms and the slice zero at time point T0=1500 ms; here the slice with index 0 denotes the first to-be-sampled slice of the second half, which is sampled after 24×62.5 ms.

Such a sampling scheme can typically have advantages in respect of reducing artifacts in fMRI. However, such an already known sampling scheme can have disadvantageous effects in respect of motion correction. In the context of motion correction, a rigid transformation model is typically adopted. This may be the case because of the exacting time requirements of prospective motion correction in particular. In addition, the anatomical context may also justify the adoption of a rigid transformation model. As the brain is completely enclosed by the skull, the rigid transformation model can describe the movements actually present comparatively well.

An example of prospective motion correction is illustrated in FIG. 1. First, reference MR data 215 is acquired for a region of interest 181 of an imaged person 101 or patient 101. The reference MR data 215 is acquired using a two-dimensional scan sequence, i.e. different slices 200 are sampled. This is shown on the left in FIG. 1.

Then an fMRI-scan sequence for acquiring MR data 216a for an MR image of the time series of MR images is acquired (FIG. 1, center). After a repetition time TR, 230 further MR data 216b for a subsequent MR image is acquired (FIG. 1, right). The MR data 216a, 216b is acquired for different slices 200-1, 200-2 in an interleaved sampling scheme as explained above (in FIG. 1 the slices arranged in an interleaved manner are illustrated using continuous and dashed lines respectively).

The MR data 216b for the next MR image is acquired using prospective motion correction. This prospective motion correction is based on motion correction parameters 220 which are determined on the basis of a comparison of the MR data 216a of the previously acquired MR image with the reference MR data 215 (in FIG. 1 the motion correction parameters 220 are illustrated as a change in the position of the ith voxel according to the jth motion degree of freedom).

In such a scenario, there is a time interval of approximately half the repetition time TR, 230 between the acquiring of MR data for two anatomically adjacent slices. Typical values for the repetition time TR, 230 are in the order of about 2000 to 3000 ms. It can happen that patient movement occurs during acquisition of the MR data 216a, 216b for one of the MR images. The movement can be caused by respiration or a slight displacement of the head, for example. Such a movement can typically have a significant effect on the information content of the MR data.

As this is typically a small continuous movement which is not consciously caused by the patient, the assumption of a rigid transformation for chronologically sampled slices—at a time interval of 62.5 ms in the above example—is justified. However, this assumption of rigid transformation is often not fulfilled, or not well fulfilled, in the case of an interleaved sampling scheme for anatomically adjacent slices; in the scenario discussed here, there is a much greater time interval between the sampling of these slices—half the repetition time TR, 230, i.e. 1500 ms, in the example. In particular, the time interval for sampling anatomically adjacent slices is typically of the same order of magnitude as the duration of the patient's respiratory movement. Thus the anatomy contained in the image may be significantly at variance with the intended position of the slice. The assumption of a rigid transformation cannot be fulfilled, or only to a limited extent.

Figure 2:
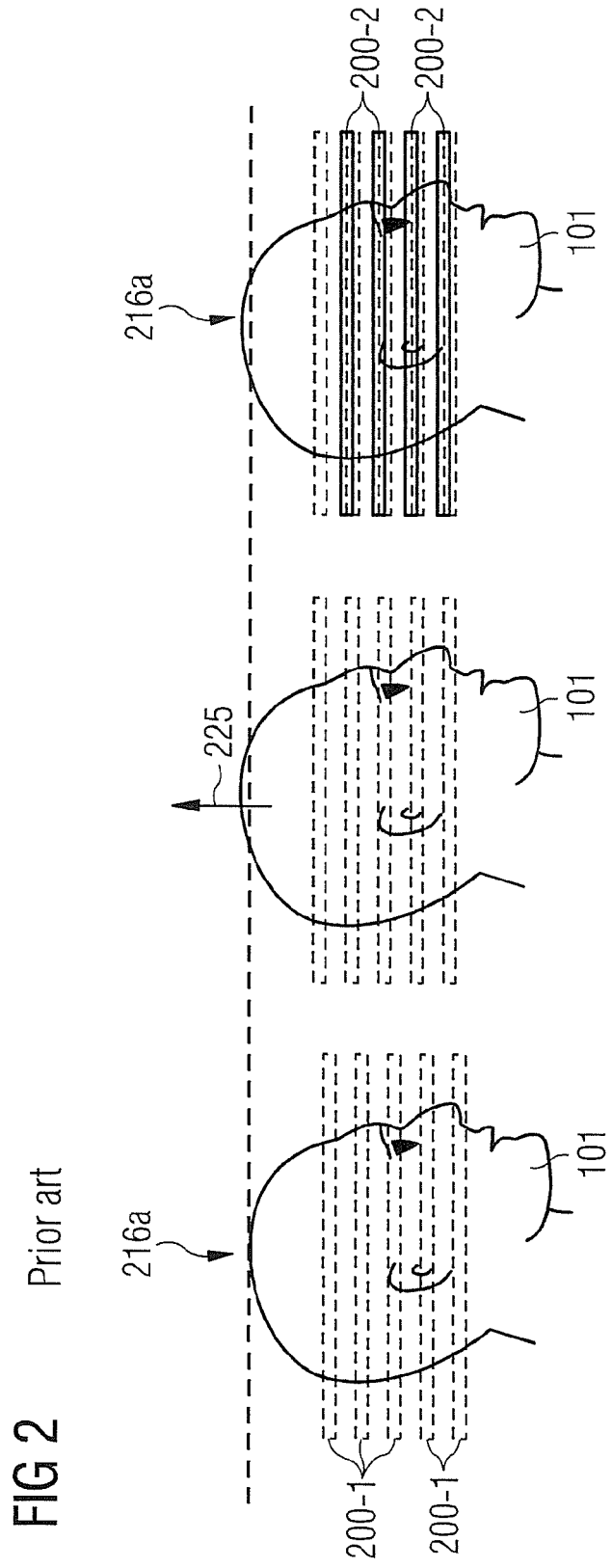
FIG. 2 illustrates disadvantages and limitations of the technique according to FIG. 1.
Figure 3:
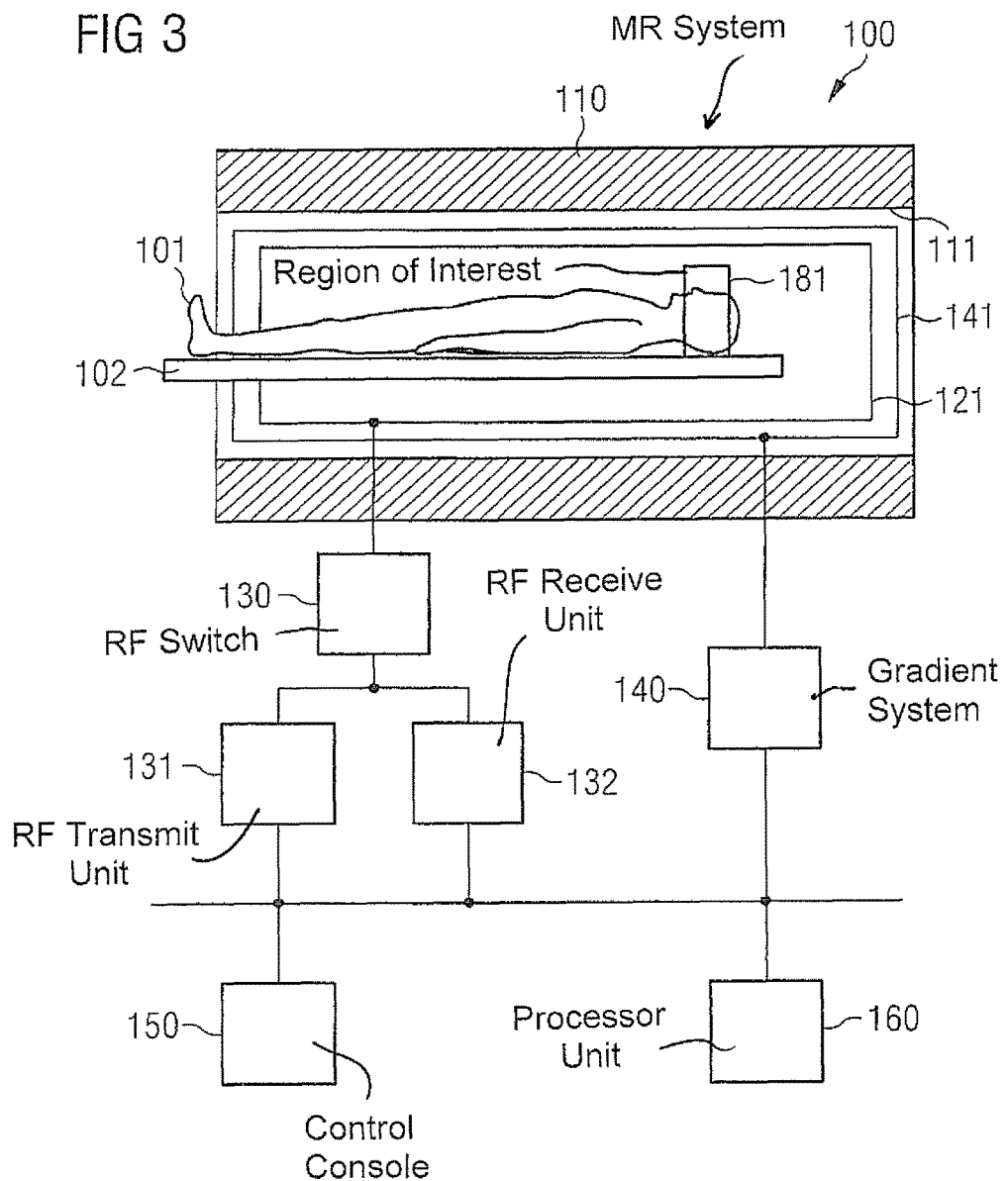
FIG. 3 schematically illustrates an MR system which is designed to implement the inventive concepts and techniques.

This situation is illustrated by FIG. 2. In FIG. 2 it is assumed that the repetition time TR, 230 assumes a value of 3000 ms. In FIG. 2, the initial situation is shown on the left, i.e. prior to the movement 225. The patient is typically breathing continuously. In this case, however, it is assumed for simplicity's sake that the patient takes a sudden in-breath after a particular interval of 1500 ms, thereby causing a translational movement 225 of the region of interest in the z-direction (oriented upward in FIG. 2) by +1 mm (in the center in FIG. 2, wherein the arrow illustrating the movement 225 is shown enlarged). After an interval of again 1500 ms after the movement 225, the patient abruptly breathes out and causes an opposite translation, i.e. in the z-direction, by −1 mm (not shown in FIG. 2). Otherwise no movement takes place. The resolution of the region of interest is e.g. 2 mm in the z-direction; anatomically adjacent slices are contiguous and are not spaced apart from one another. As a result, the slices 200-2 sampled in the first interval of the interleaved sampling scheme overlap the slices 200-1 sampled in the second interval of the interleaved sampling scheme. In this example, the overlapping is 50% (shown in FIG. 2, right). The assumption of a rigid transformation for the registration of the MR data 216a to the MR data 215 is contravened.

If the assumption of a rigid transformation for the determination of the motion correction parameters is nevertheless made for determining the motion correction parameters for acquiring the MR data 216b of the subsequent MR image (not shown in FIG. 2), unwanted effects may occur. In such a case the particular motion correction parameters constitute a compromise for mapping the region of interest to a reference time point, wherein the MR data 216a for the slices 200-1 that are acquired in the first half of the repetition time TR, 230, and the MR data 216a of the slices 200-2 that are acquired in the second half of the repetition time TR, 230, provide contradictory contributions for determining the motion correction parameters. For example, as part of determining the motion correction parameters, an optimization can be carried out. In the scenario discussed here, the optimization can converge, for example, to identity with respect to reference MR data 215 (not shown in FIG. 2)—which corresponds to the motion state of the patient 101 in the first half of the repetition time TR, 230 (shown in FIG. 2, left). However, it would also be possible for the optimization to converge to the translation $z=-1$ mm, which corresponds to the motion state of the patient 101 after completion of the movement 225 in the second half of the repetition time TR, 230 (shown in FIG. 2, right). Convergence to any intermediate value of the above mentioned values is also possible. This means that in this case the motion correction parameters 220 can only be determined with a degree of uncertainty. The result of prospective motion correction is comparatively inaccurate or rather less deterministic.

Another disadvantageous effect can occur when using retrospective motion correction based on the previously detected movement 225. Here the found motion correction parameters of the rigid transformation are applied to the MR data 216a in order to correct the motion retrospectively. Interpolation from the measured MR data onto a new grid can take place. In the example illustrated in FIG. 2, this causes the image content of anatomically adjacent slices 200-1, 200-2 to be intermingled. It must be taken into account that, prior to interpolation between the MR data, the information content of each slice 200-1, 200-2 was correct, but the distance between adjacent slices 200-1, 200-2 does not correspond uniformly to the actual anatomical inter-slice separation of 2 mm.

Techniques will now be explained in which such unwanted effects can be reduced or prevented. According to such techniques, movements 225 of the patient 101 during the scan time have much less effect on the quality of the MR image. In contradistinction to the techniques described above with reference to FIGS. 1 and 2, here the region of interest 181 is not considered in its totality when determining the motion correction parameters 220 but is partitioned into individual sub-regions. This addresses the problem of anatomically adjacent slices 200-1, 200-2 being scanned at different time points at significant intervals in the case of an interleaved sampling scheme and a significant movement 225 possibly having taken place therebetween.

Such techniques can be implemented e.g. by an MR system 100 as shown in FIG. 1. The MR system 100 has a scanner that includes a magnet 110 that defines a tube 111. The magnet 110 generates a basic magnetic field parallel to its longitudinal axis. The basic magnetic field may exhibit inhomogeneities, i.e. local deviations from a nominal value. An object being scanned, here a patient 101, can be moved into the magnet 110 on a table 102. The MR system 100 also has a gradient system 140 for generating gradient fields which are used for MR imaging and for position encoding of acquired raw data. The gradient system 140 typically comprises at least three separately controllable gradient coils 141 positioned in a well-defined manner relative to one another. The gradient coils 141 enable gradient pulses or gradient fields to be applied and switched along particular spatial directions (gradient axes). The gradient coils can be used e.g. for slice selection, for frequency encoding (in the readout direction) and for phase encoding. Position encoding of the raw data can be achieved by this means. The spatial directions, which are each parallel to slice selection gradient fields, phase encoding gradient fields and readout gradient fields, need not necessarily be coincident with the machine coordinate system. Rather they can be defined e.g. in relation to a k-space which can in turn be specified on the basis of particular requirements of the respective MR scan sequence and/or can be specified on the basis of anatomical properties of the patient 101.

To excite the nuclear spins so as to depart from the polarization/alignment that arises in the basic magnetic field, i.e. magnetization in the longitudinal direction, an RF coil arrangement 121 is provided which can inject an amplitude-modulated RF excitation pulse into the patient 101. This enables a transverse magnetization to be produced. To generate such RF excitation pulses, an RF transmit unit 131 is connected to the RF coil arrangement 121 via an RF switch 130. The RF transmit unit 131 can comprise an RF generator and an RF amplitude modulation unit. The RF excitation pulses can flip the transverse magnetization 1D slice-selectively or 2D/3D position-selectively or globally out of the rest position.

In addition, an RF receive unit 132 is coupled to the RF coil arrangement 121 via the RF switch 130. MR signals of the relaxing transverse magnetization, e.g. due to inductive coupling into the RF coil arrangement 121, can be acquired as MR data via the RF receive unit 132. The MR data can map a region of interest 181. The MR data can correspond to the raw data; however, it is also possible for the raw data to be processed still further in order to obtain the MR data, For example, the raw data present in k-space can be Fourier transformed in order thus to obtain MR data in image space.

In general it is possible to use separate RF coil arrangements 121 for injection of the RF excitation pulses by means of the RF transmit unit 131 and for acquisition of the MR data by means of the RF receive unit 132. For example, a volume coil 121 can be used for injecting RF pulses and a surface coil (not shown) consisting of an array of RF coils can be used for acquiring raw data. For example, the surface coil for acquiring the raw data can consist of 32 individual RF coils and can therefore be particularly suitable for parallel imaging techniques. Corresponding techniques are well known to the average person skilled in the art and need not therefore be explained in further detail here.

The MR system 100 additionally has an operator control console 150 that can include e.g. a screen, a keyboard, a mouse, etc. The operator control console 150 is used to acquire user inputs and provide outputs for the user. For example, individual operating modes or operating parameters of the MR system 100 can be set by the user and/or automatically and/or by remote control by means of the operator control console 150.

The MR system 100 additionally has a processor unit 160. The processor unit 160 can be designed, for example, to perform various computing operations as part of MR imaging using prospective motion correction.

Figure 4:
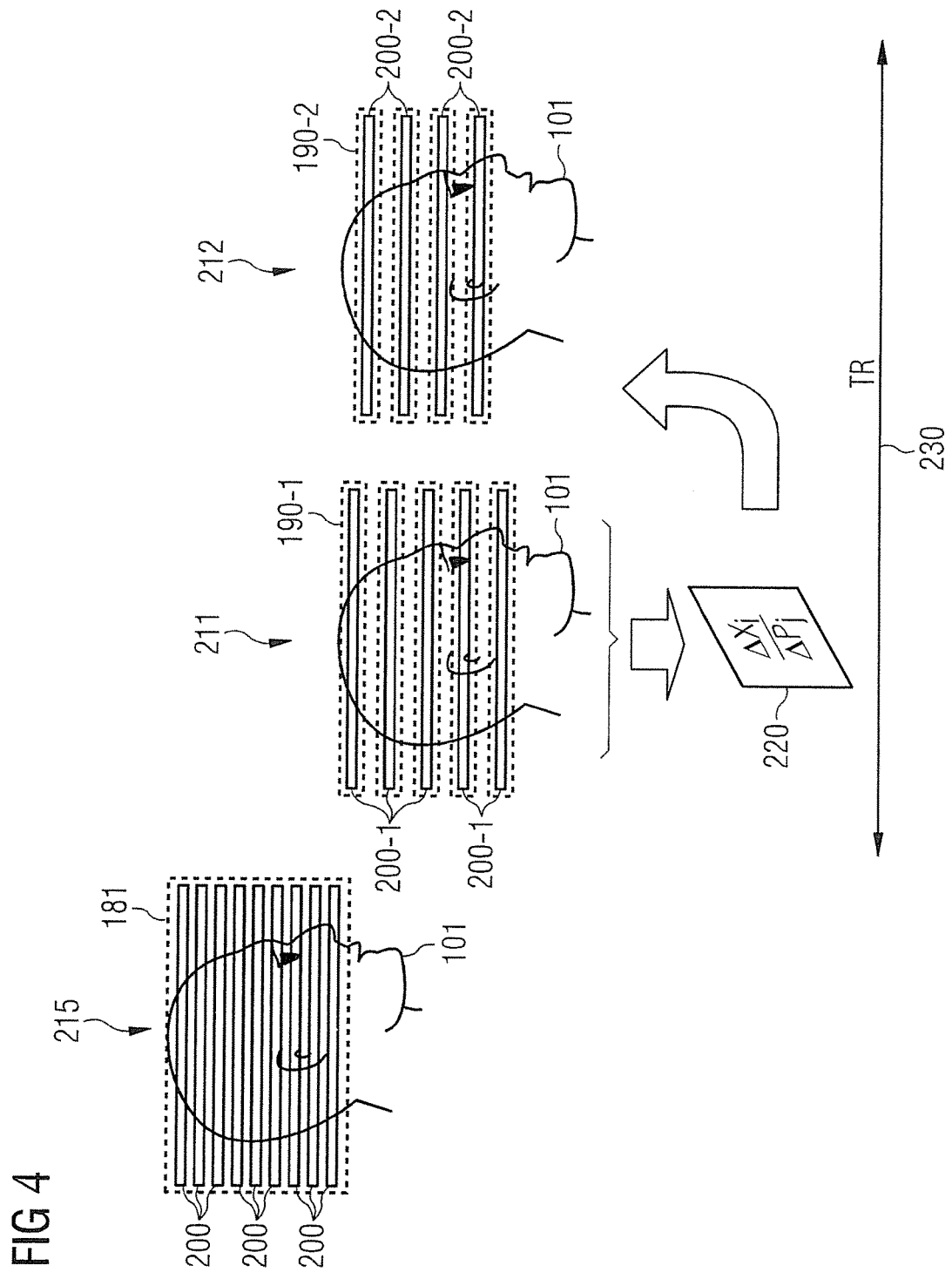
FIG. 4 illustrates a technique for prospective motion correction according to different embodiments of the present invention.

In FIG. 4 shows such a prospective motion correction technique. First the reference MR data 215 is acquired. For example, the reference MR data can be acquired using an fMRI scan sequence and therefore have a BOLD contrast. However, it would also be possible for the reference MR data 215 to have no BOLD contrast. For example, the reference MR data 215 can be acquired using a FLASH scan sequence. In the scenario in FIG. 4, the reference MR data 215 defines a region of interest 181.

First MR data 211 are then acquired. In the scenario shown here, the first MR data 211 has the same resolution as the reference MR data 215, but only one sub-region 190-1 (represented by the dotted line in FIG. 4) of the region of interest 181 is mapped. Based on a comparison of the first MR data 211 with the reference MR data 215, motion correction parameters 220 are determined. For example, the motion correction parameters 220 describe a rigid transformation of the first MR data 211 to the reference data 215. To determine the motion correction parameters 220, registration can be performed, for example.

These motion correction parameters 220 are used for prospective motion correction for acquiring second MR data 212 which maps a second sub-region 190-2 of the region of interest 181 (represented by the dotted line in FIG. 4).

In the scenario in FIG. 4 it is possible to generate an MR image based on a combination of the first MR data 211 and the second MR data 212. In other words, a combination of the first sub-region 190-1 and the second sub-region 190-2 completely covers the region of interest 181, wherein the first sub-region 190-1 is complementary to the second sub-region 190-2.

It would also be possible for e.g. third MR data (not shown in FIG. 4) to be acquired; it is basically possible for the region of interest 181 to be subdivided into more than two sub-regions 190-1, 190-2. In such a case it would be possible, again based on the second MR data 212, for motion correction parameters 220 to be determined which are used for prospective motion correction of subsequently acquired third MR data.

More than three sub-regions can also be taken into account. Here the previously acquired MR data can be taken into account in each case for prospective motion correction of subsequently acquired MR data of another sub-region. In other words, prospective motion correction can be cascaded with respect to the sub-regions.

FIG. 4 shows that a reference sequence that is used for acquiring the reference MR data 215 samples a plurality of slices 200 of the region of interest 181. This acquiring of the reference MR data 215 forms the basis for the subsequent detection of the motion 225. For example, a Gauss-Newton method can be used for motion detection. For this purpose it may be necessary to determine a gradient image of the region of interest 181 by means of the reference scan sequence. Calculating the gradient image on the basis of the reference MR data 215 is typically comparatively susceptible to motion 225 taking place during acquisition of the reference MR data 215. This applies particularly if the slices 200 of the reference MR data 215 should be acquired in an interleaved manner. For this reason, according to the scenario in FIG. 4 the region of interest 181 is not sampled by the reference scan sequence in an interleaved manner in respect of the slices 200, but in strictly ascending order. This means that the different slices 200 of the reference MR data 215 are sampled in anatomical sequence according their position in the space domain. As a result, continuous movements, e.g. due to respiration of the patient 101, stretch or compress the observed volume only slightly in a uniform manner.

FIG. 4 also shows that both a first scan sequence with which the first MR data 211 of the first sub-region 190-1 is acquired and a second scan sequence with which the second MR data 212 of the second sub-region 190-2 is acquired are two-dimensional scan sequences which provide MR data for different slices 200-1, 200-1. Here the first scan sequence and the second scan sequence sample the region of interest 181 in a slice-interleaved manner in relation to one another. In other words, there is a slice 200-2 of the second MR data 212 between adjacent slices 200-1 of the first MR data 211 in each case. In FIG. 4 the acquisition of the first MR data 211 for the first sub-region 190-1 therefore corresponds to a first pass of the interleaved sampling scheme; accordingly, the acquisition of the second MR data 212 of the second sub-region 190-2 corresponds to a second pass of the interleaved sampling scheme. For example, according to a corresponding sampling scheme, the slices 200-1 of the first MR data 211 could be sampled in an anatomical sequence (in FIG. 4 from the bottom up, for example). The same can apply to the second MR data 212. This enables in particular the time interval between the acquisition of MR data 211, 212 for anatomically adjacent slices 200-1, 200-2 to be maximized (in FIG. 4 the chronological sequence in which the different slices 200-1, 200-2 are sampled is not indicated).

In the FIG. 4 scenario, there is no waiting until the MR data 211, 212 for an MR image have been completely acquired when determining the motion correction parameters 220. Instead, the motion 225 is detected after one pass of the interleaved sampling scheme in each case. In the FIG. 4 scenario, the two sub-regions 190-1, 190-2 contain no anatomically adjacent slices 200-1, 200-2 that are sampled with a comparatively large time interval. The assumption of a rigid transformation is therefore justified.

It is possible for the acquiring of the first MR data 211, the determining of the motion correction parameters 220, the acquiring of the second MR data 212 and the generating of the MR image to be repeated a number of times to produce a time series of MR images (not shown in FIG. 4). It may be possible here, for example, on the basis of the second MR data 212, to use motion correction parameters 220 which are used for prospective motion correction of the first MR data 211 of the subsequently acquired MR image. In other words, the second pass of the interleaved sampling scheme—which corresponds to the slices 200-2 of the second MR data 212—can trigger a second execution of the determining of the motion correction parameters 220, for the first pass of the interleaved sampling scheme of the subsequently generated MR image.

By such techniques, as described above in connection with FIG. 4, various advantageous effects can be realized. First, a comparatively smaller movement 225 of the patient 101 can take place during a pass of the interleaved sampling scheme due to the reduced time required to acquire the corresponding MR data 211, 212. In addition, there are no longer any anatomically adjacent slices 200-1, 200-1 which contain contradictory image contents (cf. FIGS. 1, 2). Moreover, the motion correction parameters 220 used are comparatively recent (cf. FIG. 1) and are also obtained from consistent MR data 211.

It is possible for the MR image generated from the first MR data 211 and the second MR data 212 to undergo retrospective motion correction. For example, generating the MR image can also include determining retrospective motion correction parameters based on a comparison of the first MR data 211 with the reference MR data 215 or with other MR data which maps the region of interest 181. Accordingly, the retrospective motion correction parameters 220 can be alternatively or additionally determined on the basis of a comparison of the second MR data 212 with the reference MR data 215 or the other MR data. Then retrospective motion correction of the first MR data 211 and/or the second MR data 212 can be carried out based on the retrospective motion correction parameters 220 determined. It would also be possible e.g. for retrospective motion correction not to operate on the basis of the sub-regions 190-1, 190-2. For example, a complete MR image could always be motion-corrected on the basis of retrospective motion correction.

For example, the retrospective motion correction can include an interpolation of the first MR data 211 and/or of the second MR data 212. In the interpolation it can be taken into account that, in the FIG. 4 scenario, no obvious transformation exists that can be applied both to the first MR data 211 and to the second MR data 212. Instead different transformations exist for the first MR data 211 of the first sub-region 190-1 and the second MR data 212 of the second sub-region 190-2. This can mean that no isotropic-grid-based methods can be used as the interpolation method. Rather methods can be used which can interpolate a non-uniformly sampled volume—here the region of interest 181 composed of the first sub-region 190-1 and the second sub-region 190-2—onto a uniform grid, the so-called target voxel system. This can be compute-intensive. However, for prospective motion correction the resulting overhead is insignificant, as interpolation as part of retrospective motion correction does not need to take place in real time. It is e.g. possible to determine corresponding information which is used for retrospective motion correction as early as when determining the motion parameters 220 from the first MR data 211 as part of prospective motion correction.

Figure 5:
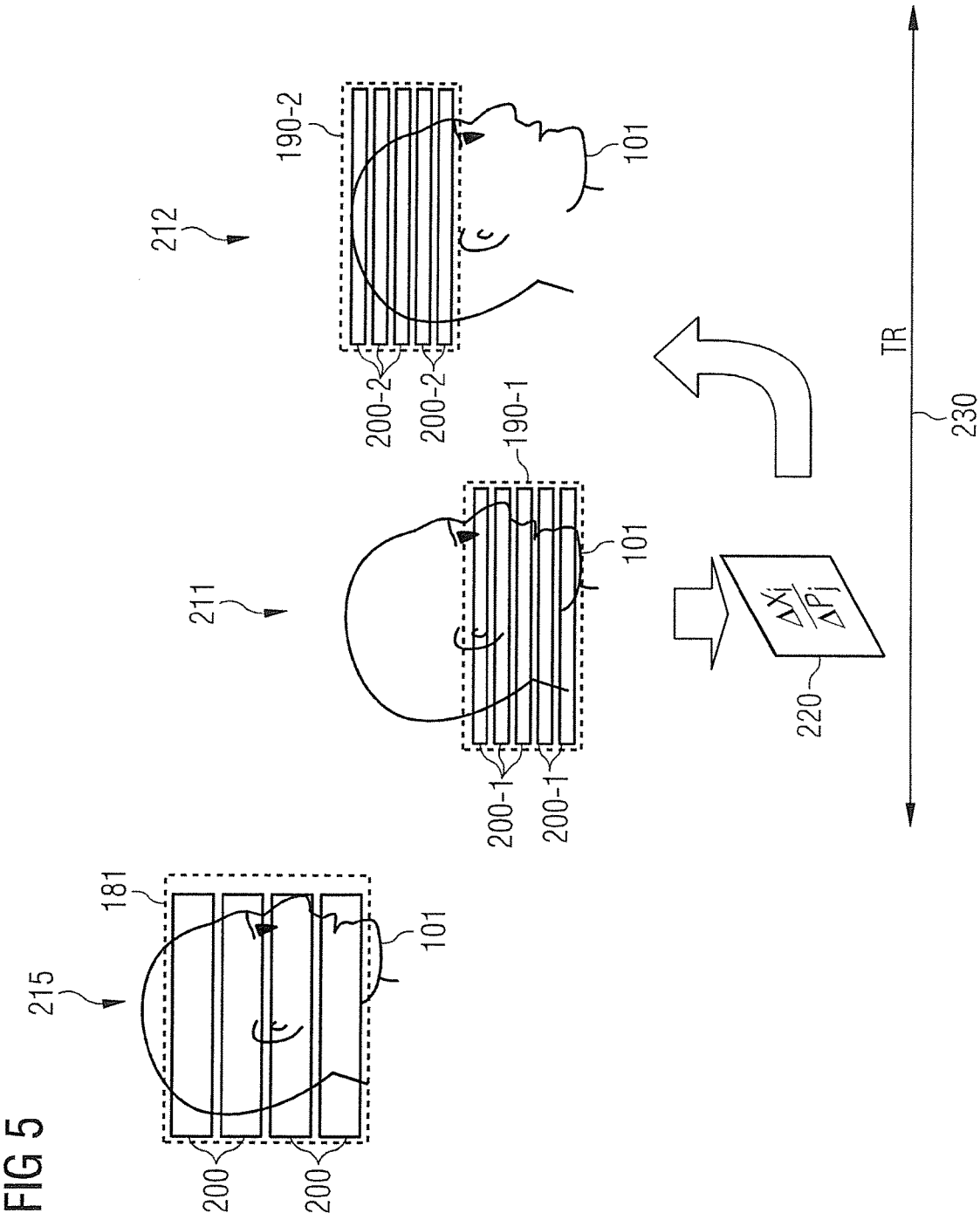
FIG. 5 illustrates a technique for prospective motion correction according to different embodiments of the present invention.

In the above, with reference to FIG. 4, a scenario was discussed in which the first scan sequence for acquiring the first MR data 211 and the second scan sequence for acquiring the second MR data 212 sample the region of interest 181 in a slice-interleaved manner in relation to one another. However, it is also possible for the first scan sequence for acquiring the first MR data 211 and the second scan sequence for acquiring the second MR data 212 to scan the region of interest 181 in a non-slice-interleaved manner (see FIG. 5). In FIG. 5 the first sub-region 190-1 and the second sub-region 190-2 are continuous and adjacent to one another. In particular, there is no slice 200-1 of the second MR data 190-2 between two nearest slices 200-1 of the first MR data 211.

In addition, it can also be seen from FIG. 5 that the resolution of the reference MR data 215 is-lower than the resolution of the first MR data 211 and the resolution of the second MR data 212. This can allow the reference scan sequence for acquiring the reference MR data 215 to be carried out relatively quickly. Any movement 225 during acquisition of the reference MR data 215 will then likely be slight.

Figure 6:
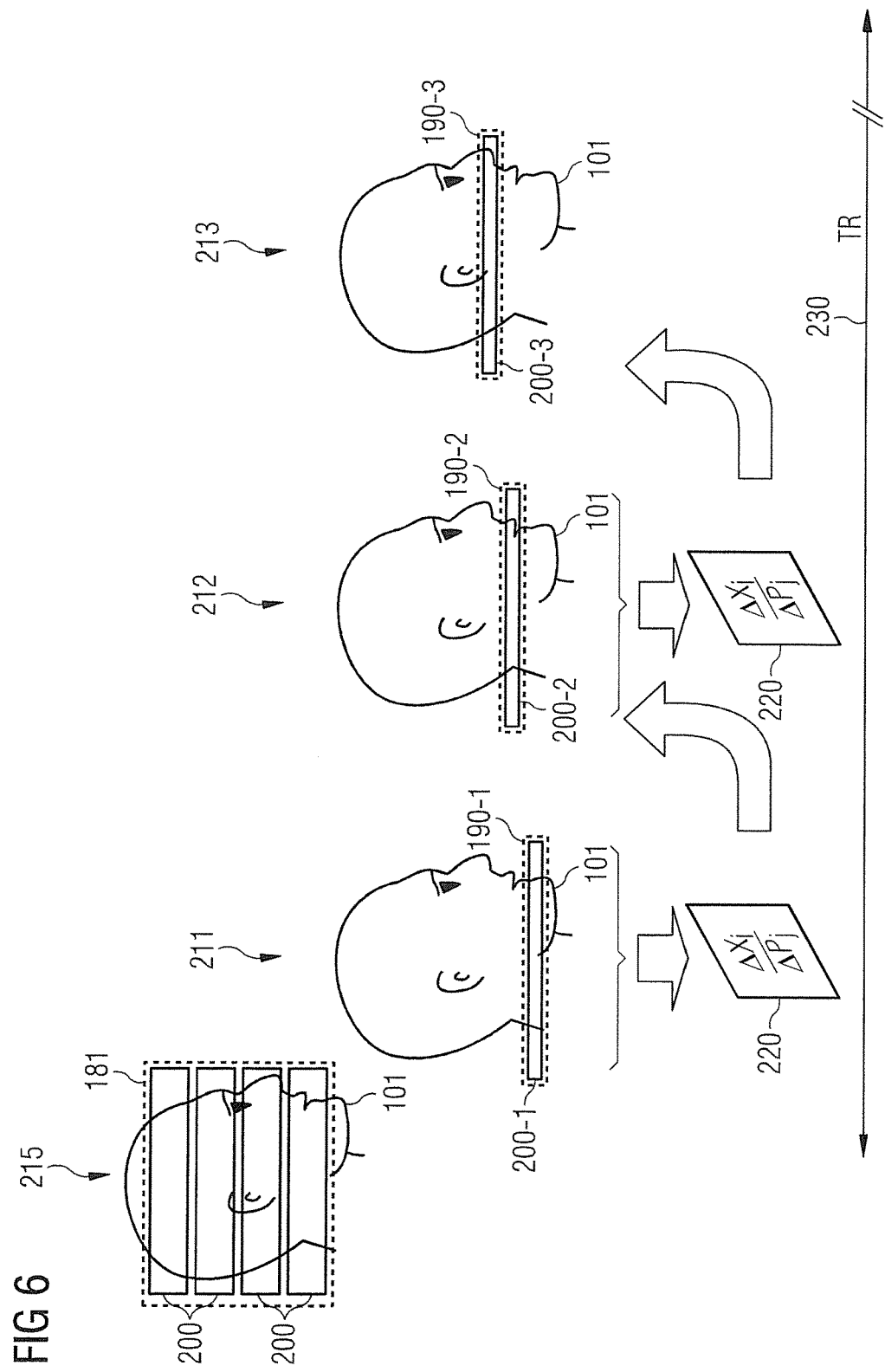
FIG. 6 illustrates a technique for prospective motion correction according to different embodiments of the present invention.

It is also possible for the first scan sequence for acquiring the first MR data 211 to sample a single slice 200-1 of the region of interest 181 (see FIG. 6). FIG. 6 also shows that motion correction parameters 220 determined on the basis of a comparison between the second MR data 212 and the reference MR data 215 can be used for prospective motion correction of a third scan sequence for acquiring third MR data 213. Whereas acquiring MR data 211, 212, 213 for three sub-regions 190-1, 190-2, 190-3 is shown in FIG. 6, in general the region of interest 181 could be partitioned into a larger number of sub-regions 190-1-190-3. In particular it may be desirable for sub-regions 190-1-190-3 to completely cover the region of interest 181.

In the above, a scenario was explained with reference to FIG. 6 in which the motion correction parameters 220 used for prospective motion correction for acquiring the third MR data 213 are determined on the basis of a comparison of the second MR data 212 with the reference MR data 215. This enables comparatively recent MR data to be taken into account as the basis for determining the motion correction parameters for other MR data; the motion correction takes into account the current motion state comparatively accurately.

However, it would also be possible for the determining of the motion correction parameters 220 used for acquiring the third MR data 213 to be based both on a comparison of the second MR data 212 with the reference MR data 215 and on a comparison of the first MR data 211 with the reference MR data 215. As the base data on which the comparison is based is larger in this case, the motion correction parameters 220 can be determined with greater accuracy. In addition, it may be possible to reduce outliers in the motion correction parameters 220, as averaging takes place over a comparatively longer period of time.

Figure 7:
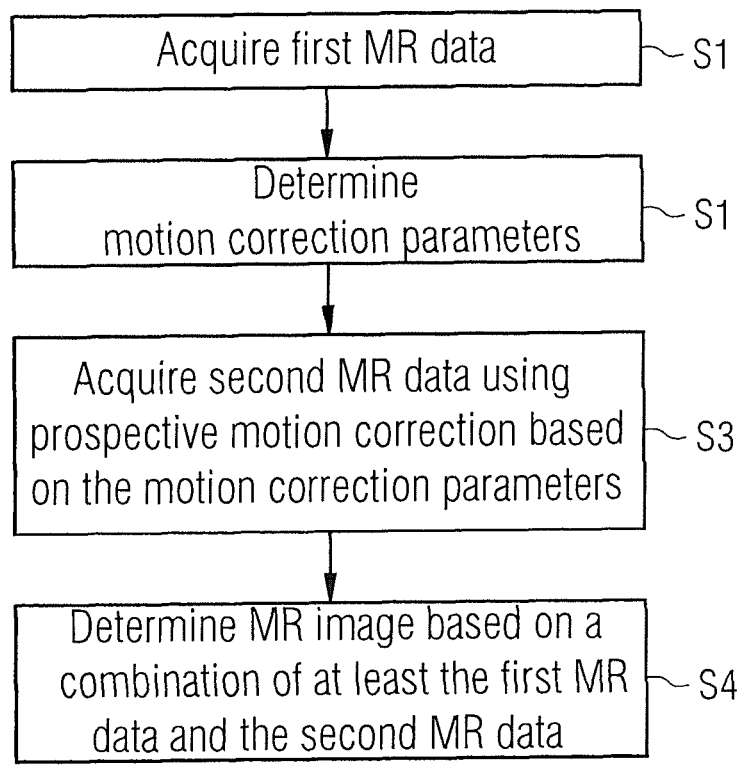
FIG. 7 is a flowchart of a method according to different embodiments of the present invention.

FIG. 7 is a flowchart of a method of MR imaging using prospective motion correction according to different embodiments. First, acquisition of the first MR data 211 takes place in step S1. Then, in step S2, the motion correction parameters 220 are determined. In said step S2, the motion correction parameters 220 are determined on the basis of a comparison of the first MR data 211 acquired in step S1 with the reference MR data 215. For example, the reference MR data 215 can be predefined; the reference MR data 215 could optionally be acquired e.g. prior to carrying out step S1.

Acquisition of the second MR data 212 with prospective motion correction then takes place in step S3. The prospective motion correction is based on the motion correction parameters that were determined in step S2.

Then, in step S4, the MR image is determined based on the first MR data 211 and based on the second MR data 212.

To obtain a time series of MR images, it would be e.g. possible to repeat steps S1-S4 for another MR image. Here it would be e.g. possible, based on the second MR data of step S3, for current motion correction parameters to be determined which are used for the subsequently acquired MR data of the MR image.

Figure 8:
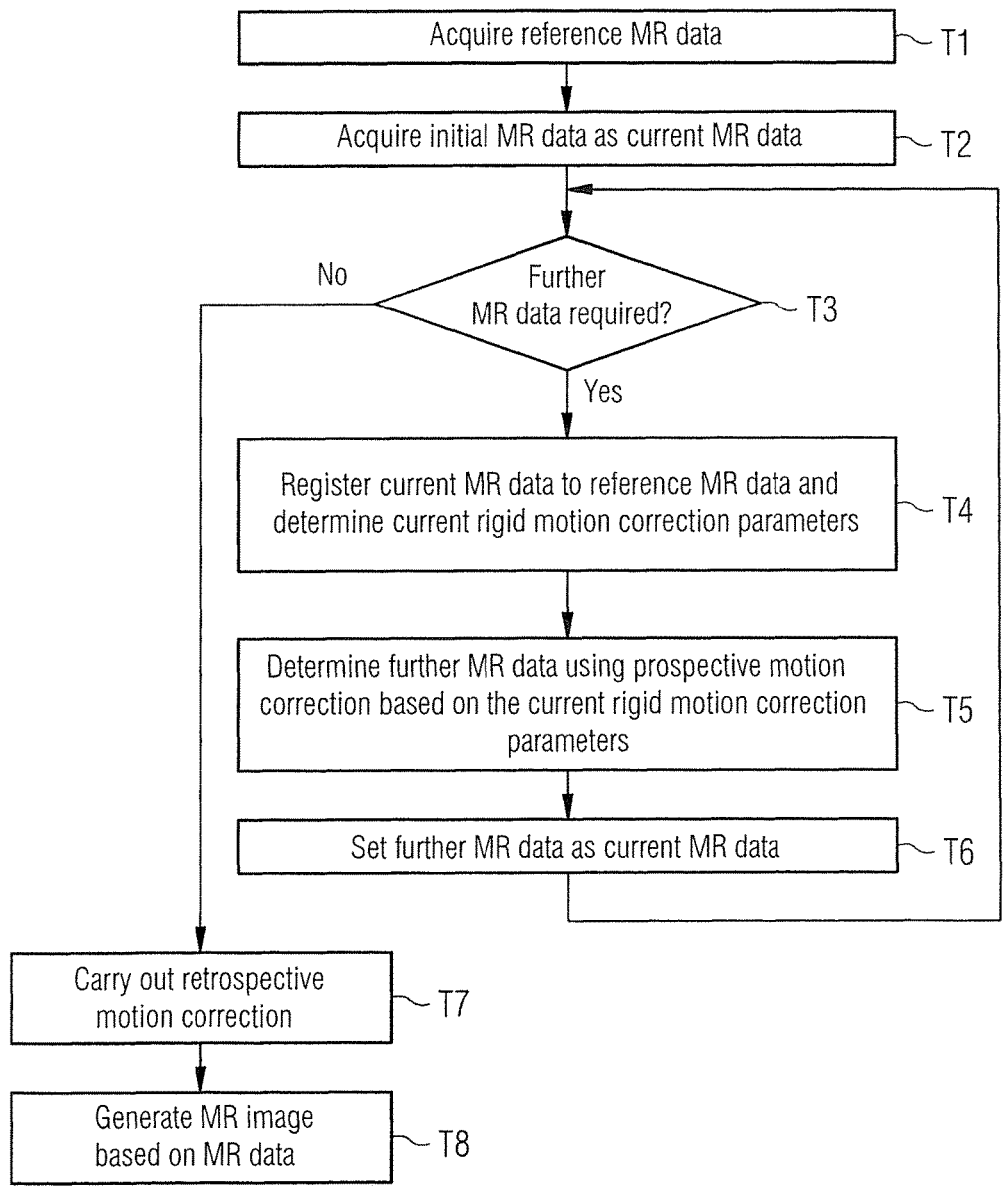
FIG. 8 is a flowchart of a method according to different embodiments of the present invention.

FIG. 8 is a flowchart or a method of MR imaging using prospective motion correction according to different embodiments of the present invention. The method begins in step T1. In step T1 the reference MR data 215 is acquired. For example, the reference MR data can be acquired in step T1 using a FLASH scan sequence. It is not necessary for the reference MR data to have e.g. a BOLD contrast. This is in particular also unnecessary if the MR image is used for fMRI and itself has a BOLD contrast.

Initial MR data is then acquired as current MR data in step T2. For example, the initial MR data can be acquired using a fMRI scan sequence and have the BOLD contrast.

In step T3 it is checked whether further MR data is required. For example, as part of step T3 it can be checked whether the MR data acquired hitherto adequately maps the region of interest 181. It would also be possible to compare the quantity of hitherto acquired MR data with a predefined threshold value. If further MR data is required, step T4 is carried out.

In step T4, the current MR data—i.e. in the first pass of the initial MR data from step T2—is registered to the reference MR data from step T1. Current rigid motion correction parameters are determined on the basis of the registration.

Then, in step T5, further MR data is acquired using prospective motion correction based on the current rigid motion correction parameters from step T4.

Next, in step T6, the further MR data is set as the current MR data.

Then, in step T3, it is again checked whether further MR data is required. If this is the case, in step T4 the now current MR data from step T6 is registered as the reference MR data 215.

As soon as it has been established in step T3 that no further MR data is required to generate the MR image, retrospective motion correction is carried out in step T7. In step T7, the motion correction parameters already determined previously in the steps T4 can be used. Alternatively or additionally, it would also be possible to determine specific motion correction parameters 220.

In the scenario in FIG. 8, in step T7 motion correction is therefore carried out after the scan time. In general, retrospective motion correction can also be carried out during the scan time, wherein even then the results of retrospective motion correction are not fed back to the scan sequence in order to counteract a movement as early as during the scan. Thus it is possible, for example, to carry out retrospective motion correction even during the scan time. The motion content can therefore be corrected at an early stage. Such motion content can often not be corrected by prospective motion correction, as prospective motion correction often lags slightly behind the current motion state, approximately for the time for step T6, reconstruction into image space, step T4, feedback to the scan sequence, tracking of the gradient system.

In step T8, the MR image is generated on the basis of the MR data that was acquired in steps T2 and T5.

In general, it is possible for steps T1-T8 to be repeated for further MR images in a time series of MR images. It may be possible here for the initial MR data from step T2 of the different MR images to be acquired using prospective motion correction, wherein motion correction parameters recently determined for the previous MR image can be used.

In summary, techniques have been described above which enable a patient's movements to be robustly determined and allow this information to be used for both prospective motion correction and retrospective motion correction. In particular, such techniques can have particular advantages for interleaved sampling schemes of two-dimensional scan sequences.

Many different advantageous effects can be achieved. First, the patient's movements during the scan can be modeled more precisely. In particular, motion correction parameters determined constitute no compromise on complete volume acquisition of a region of interest. Instead, a desired time resolution of the motion correction parameters can be flexibly selected by selection of the sub-regions, wherein e.g. a minimum update interval of the motion correction parameters corresponds to sampling of an individual slice. Such a technique for mapping a continuous movement by piecewise rigid transformation reduces error in determining the motion correction parameters with respect to the actual trajectory of the movement. At the same time, however, the comparatively large overhead of non-rigid registration is avoided.

A second advantageous effect is the speeding-up of an update cycle of motion correction parameters. Thus it is possible to detect the movement and determine motion correction parameters as early as after acquiring MR data for a single sub-region of the region of interest. In particular it is not necessary to acquire MR data completely for the entire region of interest before the motion can be detected. This typically reduces the required computing capacity for determining the motion correction parameters, and the amount of MR data to be taken into account is reduced. In addition, this can be particularly useful in the case of prospective motion correction, as it enables the patient's movement to be compensated as early as during the scan time for an MR image. The above referenced technique of S. Thesen et al. typically has a delay of some four seconds for a repetition time TR of 2000 ms (cf. the above mentioned publication of Thesen, FIG. 1). Using the techniques presented here, this time for determining the motion correction parameters can be significantly reduced depending on the number of sub-regions into which the region of interest is subdivided. As a result, the subsequent interpolation for correcting the image data has to correct a much smaller movement, thereby also enabling the interpolation effects to be markedly reduced.

A third advantage is the increased quality of the motion-corrected data. As shown above in connection with FIG. 2, patient movement during acquisition of the MR data typically means that the anatomy actually represented in a slice by the transformation does not correspond to the expected anatomy. The techniques presented here are capable of significantly reducing this error, with the result that the motion-corrected data represents the anatomy with significantly fewer motion artifacts. In addition, in the case of fMRI, the calculated statistical result cards or activation cards greatly increase in significance as a result of the techniques presented here. In addition to the reasons already cited, the reduction in the additional blurring of the MR data caused by the movement during interpolation can also contribute to this. As shown in FIG. 2 discussed above, a relatively small movement in the z-direction typically already results in a elongation of the anatomy between a sampled slice having an even index and a subsequently sampled slice having an odd index. On the other hand, the anatomy is compressed between a slice having an odd index and a subsequently sampled slice having an even index.

Another advantageous effect is that better consistency between anatomically adjacent slices can be achieved. According to the techniques discussed here, the anatomy is typically distorted much less due to motion. This increases the diagnostic value. The problem of patient movement during slices sampled in an interleaved manner and its effect on the diagnosis of multiple sclerosis has been examined e.g. in an article by E. L. Gedamo in J. Magn. Reson. Imag. 36 (2012) 332-343. Motion artifacts described as disadvantageous there which result in parts of the anatomy not being represented can be reduced by the techniques discussed herein. Such effects may be advantageous particularly for motion detection techniques which determine the patient's movement by using a gradient image.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method far magnetic resonance imaging using prospective motion correction, comprising:
   operating a magnetic resonance scanner to acquire a first set of magnetic resonance data that maps a first sub-region of a region of interest in a subject, said region of interest exhibiting motion;
   providing said first set of magnetic resonance data to a computer and, in said computer, automatically determining motion correction parameters by comparing said first set of magnetic resonance data with reference magnetic resonance data that map said region of interest;
   operating said magnetic resonance scanner to acquire a second set of magnetic resonance data that maps a second sub-region of said region of interest using prospective motion correction based on said motion correction parameters; and
   in said computer, generating a magnetic resonance image from a combination of at least said first set of magnetic resonance data and said second set of magnetic resonance data, and making said magnetic resonance image available in electronic form, as a data file, from said computer.

2. A method as claimed in claim 1 comprising:
   acquiring said first set of magnetic resonance data by operating said magnetic resonance scanner using a first functional magnetic resonance imaging (fMRI) scan sequence having a blood-oxygenation-level-dependent (BOLD) contrast; and
   acquiring said second set of magnetic resonance data by operating said magnetic resonance scanner using a second fMRI scan sequence having said BOLD contrast.

3. A method as claimed in claim 1 comprising acquiring said first set of magnetic resonance data by operating said magnetic resonance scanner using a two-dimensional scan sequence that acquires magnetic resonance data from at least one slice of said region of interest; and
   acquiring said second set of magnetic resonance data by operating said magnetic resonance scanner using a two-dimensional scan sequence that acquires magnetic resonance data from at least one slice of the region of interest.

4. A method as claimed in claim 3 comprising acquiring said first set of magnetic resonance data from a single slice of said region of interest, and determining said motion correction parameters by a slice-to-volume registration of said first set of magnetic resonance data with said reference magnetic resonance data.

5. A method as claimed in claim 3 comprising acquiring said first set of magnetic resonance data from a plurality of slices of the region of interest and acquiring the second set of magnetic resonance data from a plurality of slices of the region of interest, interleaved during acquisition with said plurality of slices of said first set of magnetic resonance data.

6. A method as claimed in claim 3 comprising acquiring said first set of magnetic resonance data from a plurality of slices of the region of interest and acquiring the second set of magnetic resonance data from a plurality of slices of the region of interest without interleaving slices with said plurality of slices in said first set of magnetic resonance data.

7. A method as claimed in claim 6 comprising:
   acquiring said first set of magnetic resonance data by operating said magnetic resonance scanner in a functional magnetic resonance imaging sequence with blood-oxygen-level-dependent (BOLD) contrast; and
   acquiring said reference magnetic resonance dataset without said BOLD contrast.

8. A method as claimed in claim 6 comprising acquiring said reference magnetic resonance data with a resolution that is different from a resolution of said first set of magnetic resonance data and a resolution of said second set of magnetic resonance data.

9. A method as claimed in claim 1 comprising:
   determining further motion parameters in said computer by comparing at least said second set of magnetic resonance data with said reference magnetic resonance data;
   operating said magnetic resonance scanner to acquire a third set of magnetic resonance data that maps a third sub-region of said region of interest using prospective motion correction based on said further motion correction parameters; and
   generating said magnetic resonance image from a combination of at least said first set of magnetic resonance data, said second set of magnetic resonance data, and said third set of magnetic resonance data.

10. A method as claimed in claim 9 comprising determining said further motion correction parameters also using a comparison of said first set of magnetic resonance data with said reference magnetic resonance data.

11. A method as claimed in claim 1 comprising:
    generating said magnetic resonance image by determining prospective motion correction parameters from a comparison of said first set of magnetic resonance data with said reference magnetic resonance data or a comparison with further magnetic resonance data that maps said region of interest; and
    performing prospective motion correction of said first set of magnetic resonance data based on retrospective motion correction parameters.

12. A method as claimed in claim 1 comprising generating said motion correction parameters to designate a rigid transformation of said first set of magnetic resonance data onto said reference magnetic resonance data.

13. A method as claimed in claim 1 comprising repeatedly acquiring said first set of magnetic resonance data, determining said motion correction parameters, acquiring said second set of magnetic resonance data, and generating said magnetic resonance image, to obtain a time series of magnetic resonance images.

14. A method as claimed in claim 1 comprising operating said magnetic resonance scanner to acquire said second set of magnetic resonance data from said second sub-region wherein said second sub-region is different from said first sub-region.

15. A magnetic resonance apparatus comprising:
   a magnetic resonance scanner;
   a control computer configured to operate said magnetic resonance scanner to acquire a first set of magnetic resonance data that maps a first sub-region of a region of interest in a subject, said region of interest exhibiting motion;
   an image reconstruction computer, provided with said first set of magnetic resonance data, said image reconstruction computer being configured to automatically determine motion correction parameters by comparing said first set of magnetic resonance data with reference magnetic resonance data that map said region of interest;
   said control computer being configured to operate said magnetic resonance scanner to acquire a second set of magnetic resonance data that maps a second sub-region of said region of interest using prospective motion correction based on said motion correction parameters; and
   said image reconstruction computer being configured to generate a magnetic resonance image from a combination of at least said first set of magnetic resonance data and to make said second set of magnetic resonance data, and making said magnetic resonance image available in electronic form, as a data file, from said computer.

* * * * *